United States Patent
Ito

(10) Patent No.: US 8,924,678 B2
(45) Date of Patent: Dec. 30, 2014

(54) MEMORY CARD AND HOST DEVICE THEREOF

(75) Inventor: Takafumi Ito, Ome (JP)

(73) Assignee: Kabushiki Kaisha Toshiba, Tokyo (JP)

(*) Notice: Subject to any disclaimer, the term of this patent is extended or adjusted under 35 U.S.C. 154(b) by 78 days.

(21) Appl. No.: 13/005,910

(22) Filed: Jan. 13, 2011

(65) Prior Publication Data

US 2011/0113188 A1  May 12, 2011

Related U.S. Application Data

(63) Continuation of application No. 12/351,889, filed on Jan. 12, 2009, now Pat. No. 7,890,729, which is a continuation of application No. 11/476,853, filed on Jun. 29, 2006, now Pat. No. 7,831,794.

(30) Foreign Application Priority Data

Jun. 30, 2005 (JP) ................. 2005-193002

(51) Int. Cl.
  *G06F 12/08* (2006.01)
  *G11C 7/22* (2006.01)
  *G06F 12/14* (2006.01)
  *G06F 13/42* (2006.01)

(52) U.S. Cl.
  CPC .............. *G06F 13/4234* (2013.01); *G11C 7/22* (2013.01); *G06F 12/1433* (2013.01)
  USPC ................................... 711/167; 711/E12.044

(58) Field of Classification Search
  CPC ............................. G11C 7/22; G06F 12/1433
  See application file for complete search history.

(56) References Cited

U.S. PATENT DOCUMENTS

| | | | |
|---|---|---|---|
| 6,076,160 A | 6/2000 | Wisor | |
| 6,282,128 B1 | 8/2001 | Lee | |
| 6,317,804 B1* | 11/2001 | Levy et al. | 710/305 |
| 6,681,277 B1* | 1/2004 | Ishibashi | 710/100 |
| 2001/0016887 A1* | 8/2001 | Toombs et al. | 710/102 |
| 2001/0039602 A1 | 11/2001 | Kanda et al. | |
| 2003/0117887 A1 | 6/2003 | Ohshima et al. | |
| 2004/0001349 A1* | 1/2004 | Perego et al. | 365/63 |
| 2004/0006654 A1 | 1/2004 | Bando | |
| 2004/0085832 A1 | 5/2004 | Kanda et al. | |
| 2004/0168015 A1 | 8/2004 | Roohparvar et al. | |

(Continued)

FOREIGN PATENT DOCUMENTS

| | | |
|---|---|---|
| CN | 1471787 A | 1/2004 |
| JP | 2001-216258 | 8/2001 |
| JP | 2002-7321 | 1/2002 |
| JP | 2003-91463 | 3/2003 |

OTHER PUBLICATIONS

Office Action issued Apr. 19, 2011, in Japan patent Application No. 2005-193002 (with English translation).

(Continued)

*Primary Examiner* — Charles Rones
*Assistant Examiner* — Ryan Dare
(74) *Attorney, Agent, or Firm* — Oblon, Spivak, McClelland, Maier & Neustadt, L.L.P.

(57) ABSTRACT

A memory card is attached to a host device, and includes a data control circuit which transfers data with respect to the host device in synchronism with a rise edge and a fall edge of a clock signal.

14 Claims, 8 Drawing Sheets

(56) References Cited

U.S. PATENT DOCUMENTS

| | | | |
|---|---|---|---|
| 2004/0268206 A1* | 12/2004 | Kim et al. | 714/758 |
| 2005/0149801 A1* | 7/2005 | Oshima | 714/731 |
| 2005/0198420 A1* | 9/2005 | Shingaki | 710/113 |
| 2006/0001494 A1 | 1/2006 | Garlepp et al. | |
| 2007/0145151 A1* | 6/2007 | Nakamura et al. | 235/492 |
| 2007/0177449 A1 | 8/2007 | Eto et al. | |

OTHER PUBLICATIONS

Office Action issued Jun. 24, 2014 in Chinese Patent Application No. 200610094293.X (with English Translation).

* cited by examiner

| Pin No. | Contents |
|---|---|
| Pin 1 | Card detection signal (CD)/data (DAT3) |
| Pin 2 | Command (CMD)/response (RES) |
| Pin 3 | Ground voltage (VSS1) |
| Pin 4 | Power supply voltage (VDD) |
| Pin 5 | Clock signal (CLK) |
| Pin 6 | Ground voltage (VSS2) |
| Pin 7 | Data (DAT0) |
| Pin 8 | Data (DAT1) |
| Pin 9 | Data (DAT2) |

| Operation mode | Pin No. | Contents |
|---|---|---|
| SD mode (4-bit) | Pin 1 | Card detection signal (CD)/data (DAT3) |
| | Pin 2 | Command (CMD)/response (RES) |
| | Pin 5 | Clock signal (CLK) |
| | Pin 7 | Data (DAT0) |
| | Pin 8 | Data (DAT1) |
| | Pin 9 | Data (DAT2) |
| SD mode (1-bit) | Pin 1 | Reservation |
| | Pin 2 | Command (CMD)/response (RES) |
| | Pin 5 | Clock signal (CLK) |
| | Pin 7 | Data (DAT0) |
| | Pin 8 | Unused |
| | Pin 9 | Unused |
| SPI mode | Pin 1 | Chip select signal (CS) |
| | Pin 2 | DATA IN |
| | Pin 5 | Clock signal (CLK) |
| | Pin 7 | DATA OUT |
| | Pin 8 | Unused |
| | Pin 9 | Unused |

FIG. 4

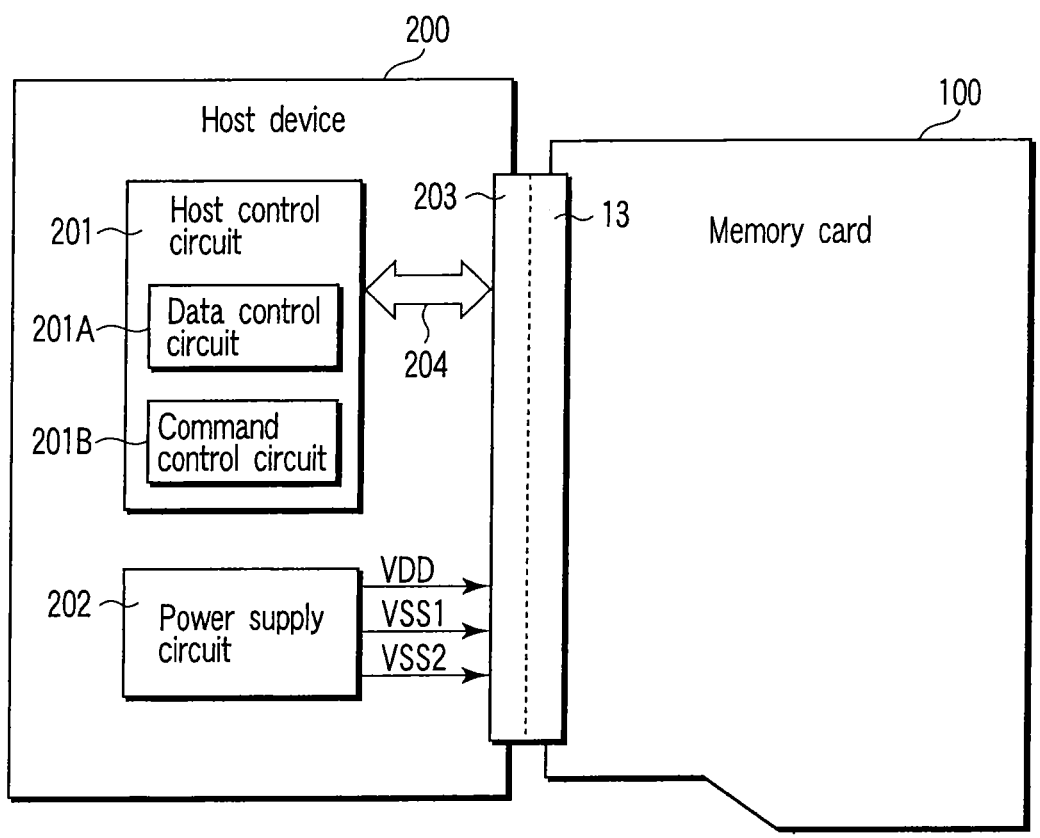
F I G. 10

MEMORY CARD AND HOST DEVICE THEREOF

CROSS-REFERENCE TO RELATED APPLICATIONS

This application is a continuation of and claims the benefit of priority under 35 U.S.C. §120 from U.S. Ser. No. 12/351,889 filed Jan. 12, 2009, which is a continuation of U.S. Pat. No. 7,831,794 issued Nov. 9, 2010, and claims the benefit of priority under 35 U.S.C. §119 from Japanese Patent Application No. 2005-193002 filed Jun. 30, 2005, the entire contents of each of which are incorporated herein by reference.

BACKGROUND OF THE INVENTION

1. Field of the Invention

This invention relates to a memory card having a nonvolatile memory and a host device thereof and more particularly to a memory card having a flash memory and a host device thereof.

2. Description of the Related Art

As a data storage medium used for, for example, a digital camera or mobile telephone, a small-sized memory card is developed. The memory card can transfer data with respect to a host device such as a digital camera or mobile telephone in a state in which the memory card is attached to the host device. As one type of the memory card, an SD™ (secure digital) memory card using a flash memory in the storage circuit is known.

For the SD™ memory card, recently, it is required to enhance the write/read operation speed and it is also required to enhance the transfer speed of a bus contained in the memory card. In the SD™ memory card, enhancement (25 MHz→50 MHz) of the transfer clock rate of the bus is defined by the "Physical Specifications, Ver. 1.1" and a higher-speed data transfer operation can be attained.

It is supposed that an even higher-speed data transfer operation is required in future, but in order to satisfy the above requirement, means for (1) further enhancing the transfer clock rate, (2) increasing the transfer data width (at present, 4-bit parallel at maximum) or the like is taken into consideration.

However, in the case of (1) enhancement of the transfer clock rate, there occurs a problem that an influence by noise increases or definition of timings becomes severe due to the enhanced clock rate. Further, in the case of (2) an increase in the bus width, there occurs a problem that the cost rises since the number of input/output pins of the SD™ memory card is increased.

As the related technique of the above type, the technique for efficiently transfer stream data on the bus is disclosed (refer to Jpn. Pat. Appln. KOKAI Publication No. 2001-216258).

BRIEF SUMMARY OF THE INVENTION

According to a first aspect of the present invention, there is provided a memory card attached to a host device, comprising: a data control circuit which transfers data with respect to the host device in synchronism with a rise edge and a fall edge of a clock signal.

According to a second aspect of the present invention, there is provided a host device to which a memory card is attached, comprising: a data control circuit which executes a first mode to transfer data in synchronism with a rise edge and a fall edge of a clock signal and a second mode to transfer the data in synchronism with one of the rise edge and the fall edge of the clock signal; and a command control circuit which generates a check command to check whether the memory card supports the first mode.

BRIEF DESCRIPTION OF THE SEVERAL VIEWS OF THE DRAWING

FIG. 4 is a diagram illustrating signal assignment to signal pins in the respective operation modes of the memory card 100;

FIG. 10 is a block diagram showing the configuration of a host device 200 shown in FIG. 1.

DETAILED DESCRIPTION OF THE INVENTION

There will now be described an embodiment of the present invention with reference to the accompanying drawings. In the following explanation, portions which have the same functions and configurations are denoted by the same reference symbols and the repetitive explanation thereof is made only in a required case.

Figures 1, 2:
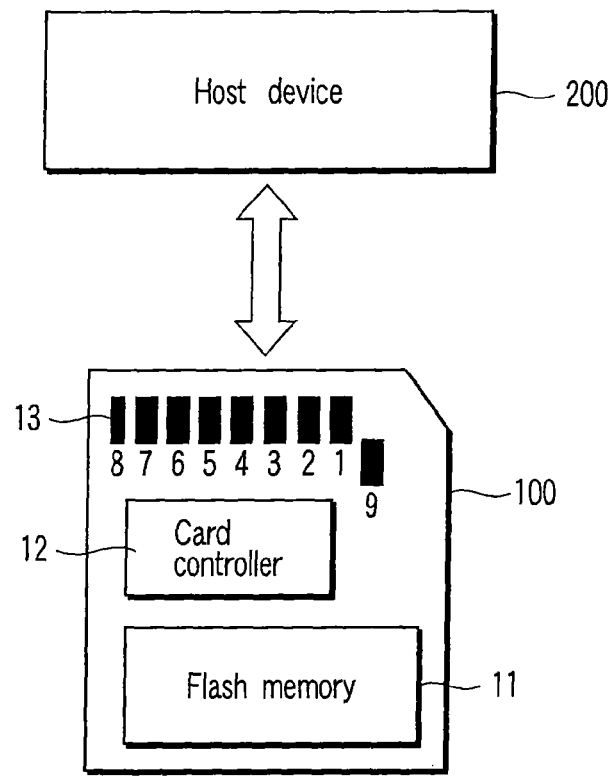
FIG. 1 is a schematic diagram showing the configuration of a memory card 100 according to one embodiment of the present invention.
FIG. 2 is a diagram illustrating signal assignment to signal pins of the memory card 100.

FIG. 1 is a schematic diagram showing the configuration of a memory card 100 according to one embodiment of the present invention. The memory card 100 is configured by an SD™ memory card, for example. The memory card 100 is normally attached to a host device 200 and used as one type of external storage with respect to the host device 200. As the host device 200, an information processing apparatus including a digital still camera or personal computer which processes various types of data items such as image data, music data or ID (identity) data is provided, for example.

The memory card 100 transfers data (sends or receives data) with respect to the host device 200.

The memory card 100 includes a flash memory 11, a card controller 12 which controls the flash memory 11, and a connector 13 (including pins "1" to "9").

The connector 13 is electrically connected to the host device 200 in a state in which the memory card 100 is attached to the host device 200. Assignment of signals to the pins "1" to "9" included in the connector 13 is shown in FIG. 2, for example. Data items DAT0, DAT1, DAT2 and DAT3 are respectively assigned to the pins "7", "8", "9" and "1". Further, the pin "1" is assigned to a card detection signal CD. A command CMD and a response RES which is a response signal of the memory card 100 corresponding to the command CMD are assigned to the pin "2". A clock signal CLK is assigned to the pin "5". Further, power supply voltage VDD, ground voltage VSS1 and ground voltage VSS2 are respectively assigned to the pins "4", "3" and "6".

The flash memory 11 is one type of EEPROM (Electrically Erasable Programmable Read Only Memory) used to electrically write and erase data and is configured by a NAND flash memory which can be integrated at a high density, for example. Data sent from the host device 200 is stored in the flash memory 11.

Figure 3:
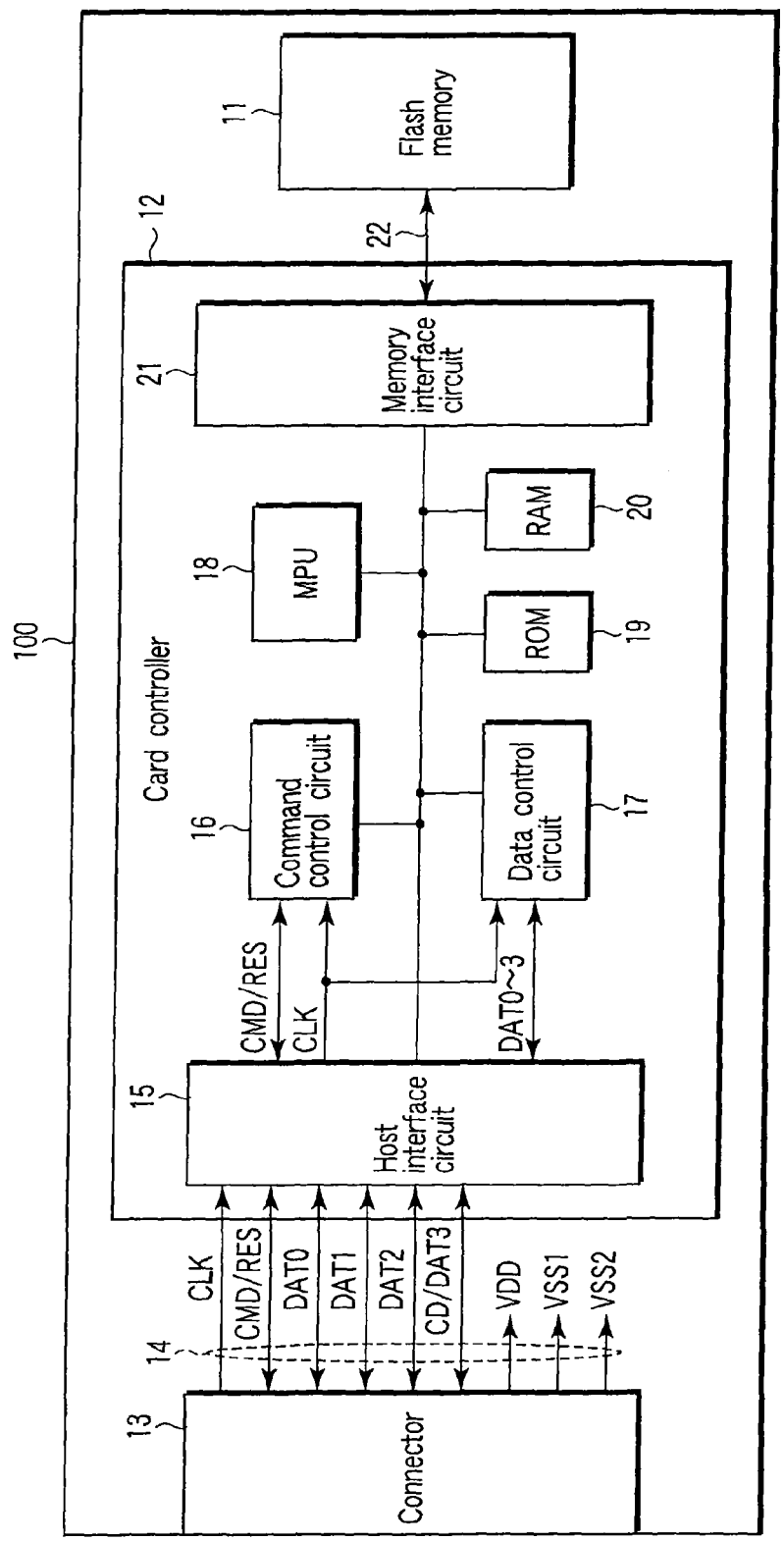
FIG. 3 is a block diagram showing the configuration of the memory card 100 shown in FIG. 1.

FIG. 3 is a block diagram showing the configuration of the memory card 100 shown in FIG. 1. The connector 13 is connected to a card controller 12 via a bus 14. The bus 14 includes a CLK line, CMD/RES line, DAT0 line, DAT1 line, DAT2 line, CD/DAT3 line, VDD line, VSS1 line and VSS2 line. The card controller 12 is connected to the flash memory 11 via an 8-bit bus 22, for example.

The card controller 12 includes a host interface circuit 15, command control circuit 16, data control circuit 17, MPU (microprocessing unit) 18, ROM (read only memory) 19, RAM (random access memory) 20 and memory interface circuit 21.

The host interface circuit 15 is connected to the host device 200 via the connector 13. The host interface circuit 15 is a function block which transfers commands, various data items or the like according to a preset protocol under control of the MPU 18.

The command control circuit 16 receives a command CMD sent from the host device 200 and interprets the command CMD. Further, the command control circuit 16 generates a response RES which is a response signal for the command CMD and sends the response RES to the host device 200. The concrete operation of the command control circuit 16 is explained later.

The data control circuit 17 transfers data based on the command CMD sent from the host device 200. Further, the data control circuit 17 generates status data (STATUS) indicating the operation state of the memory card 100 and sends the status data to the host device 200. The data control circuit 17 is connected to the host interface circuit 15 via a bus. The concrete operation of the data control circuit 17 is explained later.

The MPU 18 controls the whole operation of the memory card 100. For example, the MPU 18 reads firmware (control program) stored in the ROM 19 and supplies the same to the RAM 20 when the memory card 100 is supplied with the power supply voltage and then performs a preset process to form various tables in the RAM 20. Further, the MPU 18 receives a write command, read command, erase command or the like from the host device 200 to perform a preset process for the flash memory 11 and control the data transfer process.

The ROM 19 is a memory which stores a control program or the like used by the MPU 18. The RAM 20 is a memory which is used as a working area of the MPU 18 and temporarily stores a control program and various tables. The memory interface circuit 21 is a function block which performs an interface process between the card controller 12 and the flash memory 11.

Next, the data transfer operation mode of the memory card 100 is explained. FIG. 4 is a diagram illustrating the data transfer operation mode. In the operation mode of the memory card 100, an SD mode and SPI mode are provided. Further, in the data transfer of the SD mode, two modes including a 1-bit mode in which only data DAT0 is used and a 4-bit mode in which data items DAT0 to DAT3 are used are provided. The above operation modes are set according to a bus width changing command supplied from the host device 200.

In the case of the SD mode (4-bit mode) in which data transfer is performed in the unit of 4-bit width, all of the four pins (pins "1", "7", "8", "9") for data are used for data transfer. Further, in the case of the SD mode (1-bit mode) in which data transfer is performed in the unit of 1-bit width, only the pin "7" is used for data transfer and the pins "8", "9" for data are not used. In the SD mode, the pin "1" is used for asynchronous interruption from the memory card 100 to the host device 200, for example.

In the SPI mode, the pin "7" is used for a data signal line (DATA OUT) from the memory card 100 to the host device 200. The pin "2" is used for a data signal line (DATA IN) from the host device 200 to the memory card 100. The pins "8", "9" are not used. Further, in the SPI mode, the pin "1" is used to send a chip select signal CS from the host device 200 to the memory card 100.

In the present embodiment, as the operation mode of the memory card 100, the SD mode (4-bit mode) is explained as one example, but of course, the present embodiment can be applied to the SD mode (1-bit mode) and SPI mode.

Figure 5:
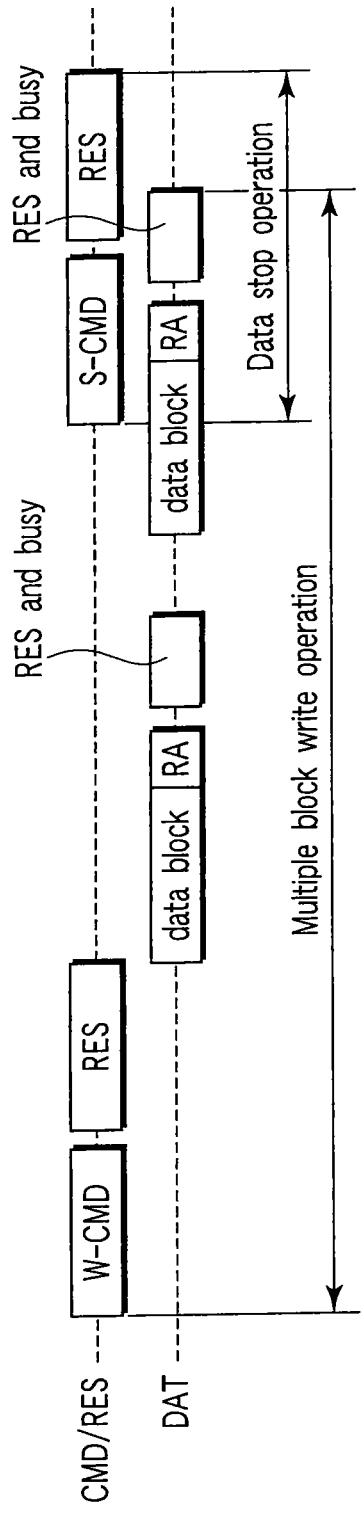
FIG. 5 is a timing chart illustrating the data write operation of the memory card 100.

Next, the operation of the memory card 100 with the above configuration is explained. First, the data write operation of the memory card 100 is explained. FIG. 5 is a timing chart illustrating the data write operation. In FIG. 5, commands, data and the like on the bus 14 are shown.

The data transfer operation is performed with one data block (for example, 512 bytes) used as a basic unit. Further, to each data block, for example, a 10-byte redundancy area (RA) is added. The redundancy area (RA) contains a CRC (Cyclic Redundancy Check) code or the like to perform the error check operation. The CRC code is generated by a CRC circuit (not shown) contained in the card controller 12. Further, the CRC circuit performs the error detection operation based on the CRC code.

Further, the data transfer operation includes a single block transfer operation for transferring data for each data block and a multiple block transfer operation for transferring data for every plural data blocks. In the present embodiment, the multiple block read operation and multiple block write operation are explained as one example, but the present embodiment can also be applied to a single block transfer operation.

First, the host device 200 sends a write command (W-CMD) to the memory card 100 to start the operation of writing data into the memory card 100. The memory card 100 receives the write command (W-CMD). Then, the command control circuit 16 interprets the write command (W-CMD) and generates a response (RES) corresponding to the write command (W-CMD). The response (RES) is sent to the host device 200 by the command control circuit 16.

Next, the host device 200 sends data block to the memory card 100. The data control circuit 17 receives the data block sent from the host device 200. The data control circuit 17 generates a CRC status response indicating that the data block has been received. The response (RES) is sent to the host device 200 via the DAT0 line by the data control circuit 17.

Next, the data control circuit 17 writes the data block sent from the host device 200 into the flash memory 11. The data control circuit 17 generates a busy signal of low level while data is being written into the flash memory 11. The busy signal is sent to the host device 200 via the DAT0 line.

When the busy signal is set to a high level, the host device 200 sends next data block to the memory card 100. After this, in the same manner as described above, the memory card 100 performs the multiple block write operation for a plurality of data blocks sent from the host device 200.

Next, the host device 200 sends a stop command (S-CMD) to the memory card 100 to interrupt the data write operation.

The memory card 100 receives the stop command (S-CMD). Then, the command control circuit 16 interprets the stop command (S-CMD) and generates a response (RES) corresponding to the stop command (S-CMD). The response (RES) is sent to the host device 200. Thus, the memory card 100 performs the data stop operation. After this, the memory card 100 terminates the data transfer operation.

Figure 6:
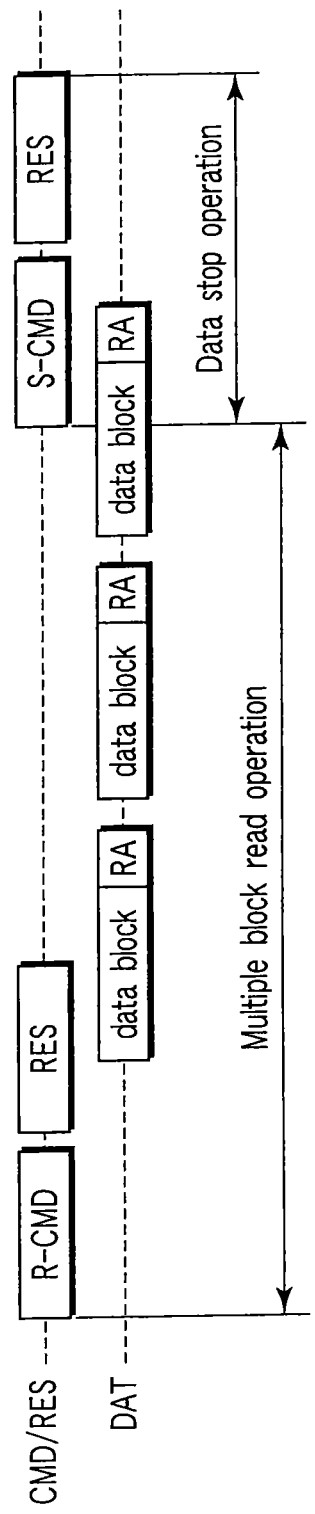
FIG. 6 is a timing chart illustrating the data read operation of the memory card 100.

Next, the data read operation of the memory card 100 is explained. FIG. 6 is a timing chart illustrating the data read operation. In FIG. 6, commands, data and the like on the bus 14 are shown.

First, the host device 200 issues a read command (R-CMD) and sends the read command (R-CMD) to the memory card 100 to start the operation of reading data from the memory card 100. The memory card 100 receives the read command (R-CMD). Then, the command control circuit 16 interprets the read command (R-CMD) and generates a response (RES) corresponding to the read command (R-CMD). The response (RES) is sent to the host device 200 by the command control circuit 16.

Next, the data control circuit 17 reads a data block from the flash memory 11. The data block is sent to the host device 200. Likewise, a plurality of data blocks are sent from the memory card 100 to the host device 200.

Next, the host device 200 sends a stop command (S-CMD) to the memory card 100 to stop the data read operation. The memory card 100 receives the stop command (S-CMD). Then, the command control circuit 16 interprets the stop command (S-CMD) and generates a response (RES) corresponding to the stop command (S-CMD). The response (RES) is sent to the host device 200 by the command control circuit 16. Thus, the memory card 100 performs the data stop operation. After this, the memory card 100 terminates the data transfer operation.

Next, the data transfer and command/response transfer operation is explained. In the present embodiment, the data transfer operation is performed based on the double-edge transfer operation which is synchronized with both of the edges of a rise edge and fall edge of a clock signal CLK. On the other hand, the command/response transfer operation is performed based on the single-edge transfer operation which is synchronized with only the rise edge (or fall edge) of the clock signal CLK.

Figure 7:
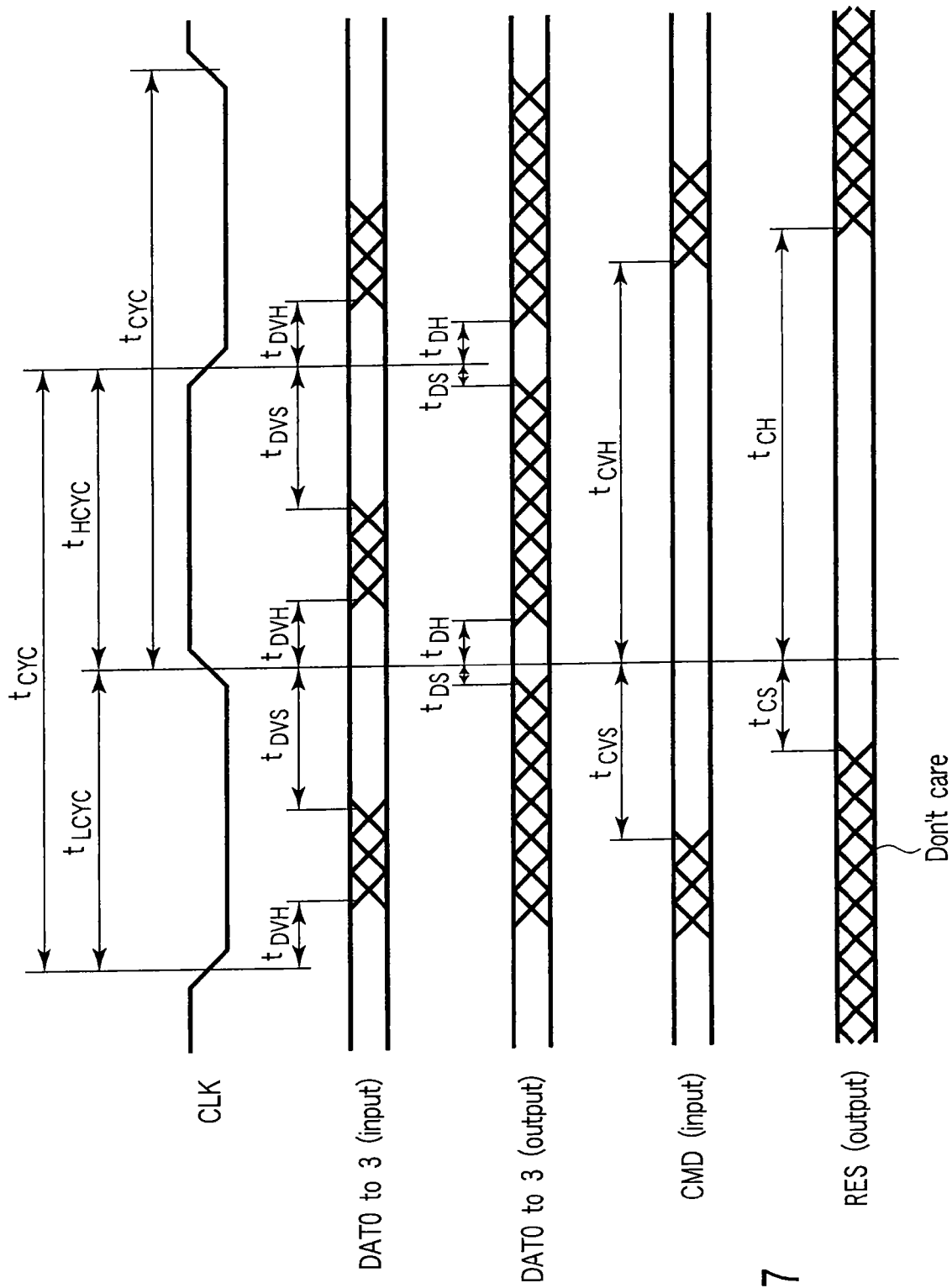
FIG. 7 is a timing chart of data transfer and command/response transfer of the memory card 100.

FIG. 7 is a timing chart illustrating the data transfer and command/response transfer operation. In FIG. 7, a command, data and the like on the bus 14 are shown. In FIG. 7, "$t_{CYC}$" indicates clock cycle time. Further, "$t_{LCYC}$" indicates low-level clock time and "$t_{HCYC}$" indicates high-level clock time.

First, the write operation (DAT0 to DAT3 (input)) of inputting data from the host device 200 to the memory card 100 is explained. The host device 200 sends data in synchronism with both of the rise edge and fall edge of a clock signal CLK. At this time, the host device 200 performs the data transfer operation to satisfy setup time $t_{DVS}$ and hold time $t_{DVH}$ based on a preset protocol. The data control circuit 17 receives data sent from the host device 200 based on the double-edge transfer operation in synchronism with both of the rise edge and fall edge of the clock signal CLK. Then, the data control circuit 17 writes the received data into the flash memory 11.

Next, the read operation (DAT0 to DAT3 (output)) of outputting data from the memory card 100 to the host device 200 is explained. The data control circuit 17 sends data in synchronism with both of the rise edge and fall edge of a clock signal CLK. At this time, the data control circuit 17 performs the data transfer operation to satisfy setup time $t_{DS}$ and hold time $t_{DH}$ based on a preset protocol. The host device 200 receives data sent based on the double-edge transfer operation from the memory card 100 in synchronism with both of the rise edge and fall edge of the clock signal CLK.

Next, the command CMD transfer operation (CMD (input)) from the host device 200 to the memory card 100 is explained. The host device 200 issues a command CMD. The host device 200 sends the command CMD to the memory card 100 in synchronism with only the rise edge of the clock signal CLK. At this time, the host device 200 performs the command CMD transfer operation to satisfy setup time $t_{CVS}$ and hold time $t_{CVH}$ based on a preset protocol. The command control circuit 16 receives the command CMD sent from the host device 200 based on the single-edge transfer operation in synchronism with only the rise edge of the clock signal CLK.

Next, the response RES transfer operation (RES (output)) from the memory card 100 to the host device 200 is explained. The command control circuit 16 generates a response RES corresponding to a command sent from the host device 200. Then, the command control circuit 16 sends the response RES to the host device 200 in synchronism with only the rise edge of the clock signal CLK. At this time, the command control circuit 16 performs the response RES transfer operation to satisfy setup time $t_{CS}$ and hold time $t_{CH}$ based on a preset protocol. The host device 200 receives the response RES sent from the memory card 100 by the single-edge transfer operation in synchronism with the rise edge of the clock signal CLK.

Thus, in the present embodiment, the command/response is transferred in synchronism with the rise edge of the clock signal CLK. On the other hand, data is transferred in synchronism with both edges of the rise edge and fall edge of the clock signal CLK.

By thus performing the data transfer operation and command/response transfer operation, the circuit which is the same as the conventional circuit can be used with respect to the CMD line for which a complex process is required and the timing condition is set severe. And, the circuit can be easily mounted. Further, in the multiple block transfer operation, the data transfer operation can be performed at a speed which is twice the rate of the clock signal CLK with respect to the DAT0 to DAT3 lines which determine the actual data transfer speed. As a result, the actual data transfer speed can be markedly enhanced. In the case of the multiple block transfer operation, a large influence is not exerted on the actual data transfer speed since the CMD line is used only for the first command and response transfer of the protocol.

Next, the switching operation between the single-edge mode in which the data transfer operation is performed by use of only the rise edge of the clock signal CLK and the double-edge mode in which the data transfer operation is performed by use of both of the rise edge and fall edge of the clock signal CLK is explained. The switching operation is performed by use of a switch command (SW-CMD) issued by the host device 200.

For example, the switch command (SW-CMD) can be used in two modes of check function and set function. For example, the mode "0" is used as the check function and the mode "1" is used as the set function. The modes are switched by setting data "0" or "1" in a mode bit (not shown) included in the command.

When the host device 200 accesses the memory card 100, it is required for the host device 200 to recognize the specification of a memory card 100 connected to the host device 200. In order to recognize the specification of the memory card 100, the host device 200 sets the switch command (SW-CMD) into the check function of the mode "0", sends the same to the memory card 100 and recognizes the specification of the memory card 100 based on status data (STATUS) returned from the memory card 100.

Next, when the memory card 100 supports the double-edge mode, the host device 200 sets the switch command (SW-CMD) into the set function of the mode "1", sends the same to the memory card 100 and sets the function (double-edge mode in this embodiment) of the memory card 100. After this, the host device 200 transfers data with respect to the memory card 100 in the double-edge mode.

Figures 8, 9:
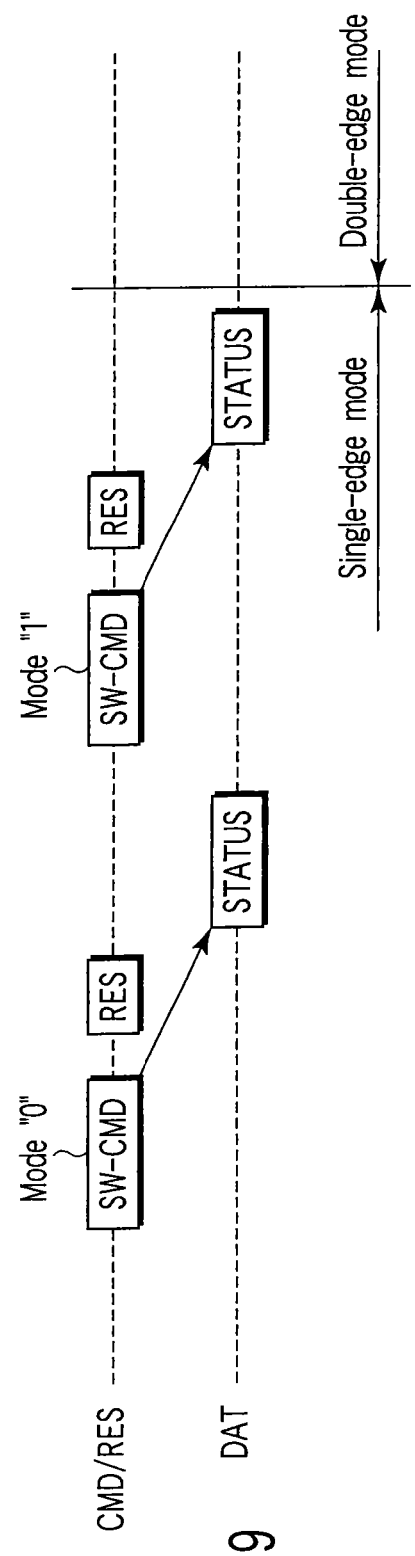
FIG. 8 is a diagram showing one example of data fields of status data (STATUS) with respect to a switch command (SW-CMD)
FIG. 9 is a timing chart illustrating the switching operation between a single-edge mode and double-edge mode.

Then, the status data (STATUS) returned from the memory card 100 in response to the switch command (SW-CMD) is explained. When the memory card 100 receives the switch command (SW-CMD) of the mode "0" (check function), it returns status data (STATUS) to the host device 200. FIG. 8 is a diagram showing one example of data fields of status data (STATUS) with respect to the switch command (SW-CMD).

For example, the status data (STATUS) includes six function groups "1" to "6". In the function groups "1" to "6", data indicating the support state of the extended function of the memory card 100 is set.

For example, in the function group "6" corresponding to a field F2, data indicating the support state of the IC card function of the memory card 100 is set. In a field F1, data indicating the maximum consumed current when the extended function supported by the memory card 100 is used is set. In the function group "5" corresponding to a field F3, data indicating the support state of the high-speed bus mode of the memory card 100 and the support state of the double-edge mode is set.

Further, in a field F4, data indicating the version of the data structure (format) of the command status is set. That is, since the format of the command status is different depending on the card version, data indicating the version is set in the field F4. When data of the field F4 is "00000001", for example, the data structure is defined in a next field F5 in the mode "0".

Next, the configuration of the switch command (SW-CMD) of the mode "1" (set function) is explained. The switch command (SW-CMD) of the mode "1" includes, for example, 24-bit data (bits "0" to "23") used to set the extended function. Data of the function group "6" is set in the bits "0" to "3" and data of the function group "5" is set in the bits "4" to "7".

Specifically, data used to invalidate the IC card function is set in the bit "0" of the function group "6". Data used to validate the IC card function is set in the bit "1" of the function group "6".

Data used to set a normal bus mode in which a normal bus clock (for example, 25 MHz) is used and a single-edge mode is set in the bit "4" of the function group "5". Data used to set a high-speed bus mode in which a high-speed bus clock (for example, 50 MHz) is used and a single-edge mode is set in the bit "5" of the function group "5". Data used to set a high-speed bus mode in which a high-speed bus clock is used and a double-edge mode is set in the bit "6" of the function group "5". Further, data items of the function groups "1" to "4" are set in the bits "8" to "23".

FIG. 9 is a timing chart illustrating the switching operation between the single-edge mode and double-edge mode. In FIG. 9, commands, data items and the like on the bus 14 are shown.

For example, it is assumed that the memory card 100 is set in the single-edge mode as a default at the starting time. First, the host device 200 issues a switch command (SW-CMD) of the mode "0" (check function). The switch command (SW-CMD) is sent to the memory card 100 in synchronism with the rise edge of the clock signal CLK.

When the memory card 100 receives the switch command (SW-CMD), the command control circuit 16 interprets the switch command (SW-CMD). Further, the command control circuit 16 sends a response RES to the host device 200 in synchronism with the rise edge of the clock signal CLK.

The data control circuit 17 generates status data (STATUS) containing support information of the double-edge mode of the memory card 100 and sends the status data (STATUS) to the host device 200 by use of a DAT line. The host device 200 recognizes the support state of the double-edge mode based on the status data.

In this case, if the memory card 100 does not support the double-edge mode, the host device 200 hereinafter performs the function of the single-edge mode with respect to the memory card 100.

On the other hand, if the memory card 100 supports the double-edge mode, the host device 200 issues a switch command (SW-CMD) of the mode "1" (set function). The switch command (SW-CMD) is sent to the memory card 100 in synchronism with the rise edge of the clock signal CLK.

When the memory card 100 receives the switch command (SW-CMD), the command control circuit 16 interprets the switch command (SW-CMD). Further, the command control circuit 16 sends a response RES to the host device 200 in synchronism with the rise edge of the clock signal CLK.

In addition, the command control circuit 16 sets the memory card 100 into the double-edge mode based on the switch command (SW-CMD). Further, the data control circuit 17 generates status data (STATUS) indicating that the switching to the double-edge mode is accepted and sends the status data (STATUS) to the host device 200 by use of the DAT line.

The operation of actually transferring data in synchronism with the double edges of the clock signal CLK after the memory card 100 is set into the double-edge mode is performed after a next command issued after the memory card 100 sends status data for the switch command (SW-CMD) of the mode "1" to the host device 200. After this, the host device 200 performs the function of the double-edge mode with respect to the memory card 100.

With the above configuration, timing of switching between the single-edge mode and double-edge mode of the internal circuit of the memory card 100 can be made clear and the circuit can be easily mounted.

Next, the configuration of the host device 200 is explained. FIG. 10 is a block diagram showing the configuration of the host device 200. The host device 200 includes a host control circuit 201, power supply circuit 202, connector 203 and bus 204.

The host control circuit 201 executes the transfer control operation for commands, data items and the like with respect to the memory card 100. Specifically, the host control circuit 201 includes a data control circuit 201A and command control circuit 201B. The data control circuit 201A performs the data transfer control operation. The command control circuit 201B performs the transfer control operation for commands, response RES, status data (STATUS).

The connector 203 is connected to the host control circuit 201 via the bus 204. Further, the connector 203 is electrically connected to the memory card 100 via the connector 13. The power supply circuit 202 generates power supply voltage VDD, ground voltage VSS1 and ground voltage VSS2. The power supply voltage VDD, ground voltage VSS1 and ground voltage VSS2 are respectively supplied to the pins "4", "3" and "6" of the memory card 100 via the connector 203.

Figure 11:
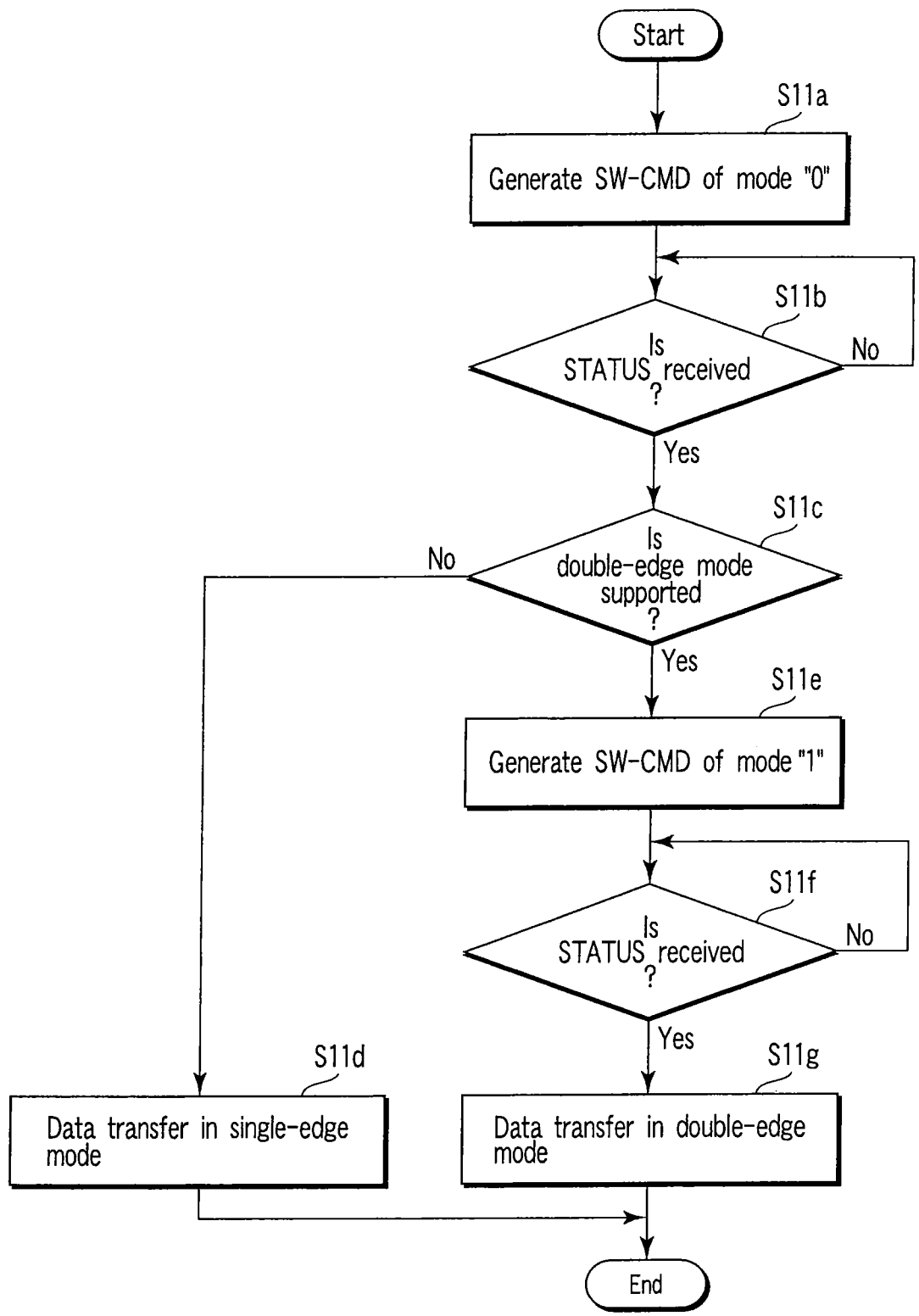
FIG. 11 is a flowchart illustrating the operation of a host control circuit 201.

The operation of the host device 200 with the above configuration is explained. FIG. 11 is a flowchart illustrating the operation of the host control circuit 201. For example, it is assumed that the memory card 100 is set in the single-edge mode as the default at the start time.

First, the command control circuit 201B generates a switch command (SW-CMD) of the mode "0" to check whether or not the memory card 100 supports the double-edge mode (step S11a). The switch command (SW-CMD) is sent to the memory card 100 by the host control circuit 201. Further, the command control circuit 201B receives a response RES of the switch command (SW-CMD) from the memory card 100.

Next, the command control circuit 201B monitors whether or not status data (STATUS) generated in response to the switch command (SW-CMD) of the mode "0" is sent from the memory card 100 (step S11b). When receiving the status data (STATUS) from the memory card 100, the command control circuit 201B determines whether or not the memory card 100 supports the double-edge mode based on the status data (STATUS) (step S11c).

If the memory card 100 does not support the double-edge mode, the host control circuit 201 hereinafter performs the function of the single-edge mode with respect to the memory card 100. That is, the data control circuit 201A transfers commands, data and the like in synchronism with the single edge of the clock signal CLK with respect to the memory card 100 (step S11d).

On the other hand, if the memory card 100 supports the double-edge mode, the command control circuit 201B generates a switch command (SW-CMD) of the mode "1" in order to switch the memory card 100 into the double-edge mode (step S11e). The switch command (SW-CMD) is sent to the memory card 100 by the host control circuit 201. Further, the command control circuit 201B receives a response RES of the switch command (SW-CMD) from the memory card 100.

Next, the command control circuit 201B monitors whether or not status data (STATUS) generated in response to the switch command (SW-CMD) of the mode "1" is sent from the memory card 100 (step S11f). When receiving the status data from the memory card 100, the host control circuit 201 recognizes that the memory card 100 is switched into the double-edge mode and hereinafter transfers data with respect to the memory card 100 in the double-edge mode. That is, the data control circuit 201A transfers a command with respect to the memory card 100 in synchronism with the single edge of the clock signal CLK and transfers data in synchronism with the double edges of the clock signal CLK (step S11g).

As described above, according to the present embodiment, the data transfer speed on the bus can be enhanced without enhancing the rate of the clock signal CLK. Further, the data transfer speed which is twice the original transfer speed at the same clock frequency can be attained by using the double-edge transferring operation.

Further, only data is transferred in the double-edge mode and the command is transferred in the single-edge mode. Therefore, the circuit which is the same as the conventional circuit can be used with respect to the CMD line for which a complex process is required and the timing condition is set severe. And, the circuit can be easily mounted. As a result, the manufacturing cost can be reduced.

Further, the field in which the double-edge mode explained in the present embodiment is set in part of the switch command used to set the extended function of the memory card is provided. Therefore, switching between the single-edge mode and the double-edge mode can be made without increasing the commands.

Further, the host device can perform the switching operation between the single-edge mode and the double-edge mode with respect to the memory card. Further, the host device can perform the double-edge transfer operation with respect to the memory card which supports the double-edge mode.

In the present embodiment, the SD memory card is explained as one example, but the present embodiment can also be applied to another memory card or memory device having the same bus configuration. Further, the NAND flash memory using the NAND cells is explained as one example, but the present invention is not limited to this case and can be generally applied to an EEPROM using nonvolatile memory cells.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A storage device couplable to a host, comprising:
a command line;
a plurality of data lines;
a clock line;
a nonvolatile memory; and
a controller coupled to the command line, the data lines and the clock line, wherein:
the controller is configured to receive a clock signal through the clock line;
the controller is configured to receive data and output a first response through the data lines, in accordance with a single edge transfer based on either one of a rise edge and a fall edge of the clock signal, in a first transfer mode;
the controller is configured to receive data and output a first response through the data lines, in accordance with a double edge transfer based on both the rise edge and the fall edge of the clock signal, in a second transfer mode;
the controller is configured to receive a first command and output a second response through the command line, in accordance with the single edge transfer;
the controller is configured to switch between the first transfer mode and the second transfer mode in response to the first command;
the controller is configured to receive the first command of the command line with the single edge transfer while transferring data of the data lines with the single edge transfer in the first transfer mode and in response to the first command to switch transferring data of the data line to the double edge transfer in the second transfer mode;
the controller is configured to perform the double edge transfer through the data lines simultaneously with the single edge transfer through the command line;
the controller is configured to receive a second command and output a third response through the command line, in accordance with the single edge transfer; and
the controller is configured to receive the second command of the command line while transferring data of the data lines, the second command being used for informing the storage device that the host stops transferring data of the data line; and
a transfer rate of the double edge transfer is higher than a transfer rate of the single edge transfer.

2. The storage device according to claim 1, wherein:
the controller is configured to receive a third command and output a fourth response through the command line, in accordance with either one of the rise edge and the fall edge of the clock signal; and the controller is configured to output first status data that includes information indicating that the storage device supports the second transfer mode, through the data lines in response to the third command.

3. The storage device according to claim 2, wherein:
the first status data includes data fields of a plurality of function groups; and
the second transfer mode is assigned to one of the function groups.

4. The storage device according to claim 3, wherein the number of the function groups is six.

5. The storage device according to claim 2, wherein the first status data further includes information on a maximum consumption current required for the second transfer mode.

6. The storage device according to claim 2, wherein:
the controller is configured to receive data through the data lines, in accordance with the clock signal having a first frequency, in a normal bus mode;
the controller is configured to receive data through the data lines, in accordance with the clock signal having a second frequency, in a high-speed bus mode;
the second frequency is higher than the first frequency; and
the first status data further includes information indicating that the storage device supports the high-speed bus mode.

7. The storage device according to claim 2, wherein:
the first status data further includes information indicating that the storage device supports an IC card function; and
the controller is configured to validate the IC card function of the storage device in response to the first command.

8. The storage device according to claim 2, wherein the first status data further includes information on a command system.

9. The storage device according to claim 1, wherein the controller is configured to read data from the nonvolatile memory and output the read data through the data lines.

10. The storage device according to claim 1, wherein the nonvolatile memory is a semiconductor memory.

11. The storage device according to claim 10, wherein the semiconductor memory is a NAND flash memory.

12. The storage device according to claim 1, wherein the controller is configured to output second status data that includes information indicating that the storage device is set into the second transfer mode, through the data lines in response to the first command.

13. The storage device according to claim 1, wherein:
the controller is configured to output data in a plurality of data blocks through the data lines; and
a CRC code is added to each of the data blocks.

14. The storage device according to claim 1, wherein:
the controller is configured to receive data through all data lines in a first bit mode; and
the controller is configured to receive data through only one of the data lines in a second bit mode.

* * * * *